(12) United States Patent
Qin et al.

(10) Patent No.: US 12,171,085 B2
(45) Date of Patent: Dec. 17, 2024

(54) EVAPORATIVE COOLING LOGIC CONTROL METHOD AND APPARATUS OF INDUCTIVE VIBRATION DEVICE

(71) Applicants: ETS SOLUTIONS (BEIJING) LTD., Beijing (CN); BEIJING INSTITUTE OF STRUCTURE AND ENVIRONMENT ENGINEERING, Beijing (CN)

(72) Inventors: Yaming Qin, Beijing (CN); Kuihua Zhang, Beijing (CN); Hongcai Zhang, Beijing (CN); Chen Chen, Beijing (CN); Kanli Tian, Beijing (CN); Shujie Xia, Beijing (CN); Zhenqiang Tian, Beijing (CN)

(73) Assignees: ETS SOLUTIONS (BEIJING) LTD., Beijing (CN); BEIJING INSTITUTE OF STRUCTURE AND ENVIRONMENT ENGINEERING, Beijing (CN)

( * ) Notice: Subject to any disclaimer, the term of this patent is extended or adjusted under 35 U.S.C. 154(b) by 0 days.

(21) Appl. No.: 17/908,256

(22) PCT Filed: Jul. 16, 2021

(86) PCT No.: PCT/CN2021/106768
§ 371 (c)(1),
(2) Date: Aug. 31, 2022

(87) PCT Pub. No.: WO2022/217769
PCT Pub. Date: Oct. 20, 2022

(65) Prior Publication Data
US 2024/0206121 A1    Jun. 20, 2024

(30) Foreign Application Priority Data
Apr. 13, 2021 (CN) .......................... 202110392925.5

(51) Int. Cl.
*H05K 7/20* (2006.01)
(52) U.S. Cl.
CPC ..... *H05K 7/20345* (2013.01); *H05K 7/20327* (2013.01); *H05K 7/20381* (2013.01)
(58) Field of Classification Search
CPC ..................... H01L 23/31; H01L 23/34; H01L 23/36–3675; H01L 23/3677;
(Continued)

(56) References Cited

U.S. PATENT DOCUMENTS

| | | | |
|---|---|---|---|
| 6,247,525 B1 * | 6/2001 | Smith | B05B 7/0012 165/104.34 |
| 2010/0312415 A1 * | 12/2010 | Loucks | H05K 7/20836 700/300 |

FOREIGN PATENT DOCUMENTS

| | | | |
|---|---|---|---|
| CN | 1885001 A | * | 12/2006 |
| CN | 205002939 U | * | 1/2016 |

(Continued)

OTHER PUBLICATIONS

CN-214852426-U English Translation (Year: 2021).*
(Continued)

*Primary Examiner* — Amir A Jalali
(74) *Attorney, Agent, or Firm* — Samson G. Yu

(57) ABSTRACT

The disclosure provides an evaporative cooling logic control method and apparatus of an inductive vibration device. The method includes the following steps: S1, starting a vibration device, and acquiring data; and S2, displaying an effective output current by a power amplifier, and judging whether the effective output current is larger than 600 amperes or not. The method has the beneficial effects that a spray auxiliary cooling mode of the inductive vibration device, which is adjusted by the logic control method of the disclosure, has simple structure and reliable function, the phenomenon of
(Continued)

insufficient induced draft and heat dissipation capacity of the prior fan of the moving coil induction ring can be effectively solved, the radial expansion can be reduced, and the method is especially suitable for heat dissipation of the moving coil induction ring of the inductive vibration device with large moving coil induction ring current and large.

6 Claims, 2 Drawing Sheets

(58) Field of Classification Search
CPC ............. H01L 23/3733; H01L 23/3735; H01L 23/427; H01L 23/46; H01L 23/473; H01L 23/4735; H01L 23/50; H05K 7/2087; H05K 7/20927; H05K 7/20218; H05K 7/20254; H05K 7/2029; H05K 7/20236; H05K 7/20309–20327; H05K 7/20345; H05K 7/20381; H05K 7/20663; H05K 7/20681; H05K 7/20709; H05K 7/20772; H05K 7/20818; H05K 7/20872; H05K 7/20881; H05K 7/20936; H05K 1/0201–0212; H05K 1/0272; H05K 1/181–188; H05K 2201/064; H05K 2201/10166; H01H 9/52; F28F 13/02

See application file for complete search history.

(56) References Cited

FOREIGN PATENT DOCUMENTS

| | | | | |
|---|---|---|---|---|
| CN | 106525370 A | 3/2017 | | |
| CN | 111417291 A | 7/2020 | | |
| CN | 112954986 A | * 6/2021 | ............. | G01M 7/02 |
| CN | 113099698 A | 7/2021 | | |
| CN | 214852426 U | * 11/2021 | ............. | G01M 7/02 |

OTHER PUBLICATIONS

CN-112954986-A English Translation (Year: 2021).*
CN-1885001-A English Translation (Year: 2006).*
CN-205002939-U English Translation (Year: 2016).*

* cited by examiner

EVAPORATIVE COOLING LOGIC CONTROL METHOD AND APPARATUS OF INDUCTIVE VIBRATION DEVICE

CROSS-REFERENCE TO RELATED APPLICATION

The application claims priority to Chinese patent application No. 2021103929255, filed to the China National Intellectual Property Administration (CNIPA) on Apr. 13, 2021 and entitled "Evaporative Cooling Logic Control Method and Apparatus of Inductive Vibration Device", the disclosure of which is hereby incorporated by reference in its entirety.

TECHNICAL FIELD

The disclosure relates to the field of methods for internal cooling of an inductive vibration table, in particular to an evaporative cooling logic control method and apparatus of an inductive vibration device.

BACKGROUND

An electric vibration table is a key test device necessary for the development of aerospace (military) products such as rockets, missiles, satellites, etc. It is widely used in product strength check, transportation environment testing, reliability and other tests, involving the development of aerospace, aviation, ships, automobiles, trains and other products in various industries and product check under simulated operating conditions. Domestic and foreign vibration test device providers usually adopt direct coupling vibration tables to generate exciting force to achieve vibration, and its working frequency is 5-2000 HZ. The maximum sweep acceleration is generally 100 G. The random no-load acceleration is generally 80 G and cannot meet the requirements of (military) civil products for the test device and continuously increased technical performance indexes (high value, large acceleration and high reliability), so that the inductive vibration table needs to be developed and produced urgently, and the technical defects of the device are overcome.

Foreign countries began to develop the inductive vibration device in the 1950s. Only the UD company in United States has successfully developed an inductive coupling vibration test device, and its products have been introduced to the market. The thrust of the vibration table covers 70-240 KN. (T2000, T4000, T5000, T5500 series) and other products are formed, the sweep acceleration can reach 220 G, and the random no-load acceleration reaches 180 G, which are superior to the current direct coupling vibration device in the domestic and foreign markets, but their key technologies have restrictions and blockades on our country.

An inductive vibration system, as a multi-disciplinary cross field (vibration test technology, vibration test device, data processing, electromagnetics and structural mechanics, etc.), has a relatively wide professional field but a relatively narrow application field, relatively rapid technology update and replacement, relatively high technical content, better product performance, high value, high acceleration and high reliability, and is the core competitiveness of the future development of the vibration test device. Beijing Institute of Structure and Environment Engineering (ETS Solutions (Beijing) Ltd.) is the earliest team engaged in the research and development of the vibration test device in China. Starting from the development of a low-thrust permanent magnet vibration exciter, inductive vibration table design, induction coil and moving coil induction ring heat calculation, electromagnetic field simulation, low-frequency large displacement and efficient conversion, IGBT high-voltage power amplifier matching, induction coil winding process and high temperature curing, dynamic simulation and optimization of moving parts (the strength and rigidity of the connection between a motion frame and a moving coil induction ring are improved), moving coil induction ring spray cooling and other key technologies and researches are gradually solved through technical reserves and explorations in nearly six years. Since 2012, the 50 KN, 100 KN and 180 KN-200 KN inductive vibration tables have been gradually marketed and localized. The maximum sweep acceleration of the domestic inductive vibration table reaches 240 G, and the maximum random no-load acceleration reaches 200 G, which are superior to the corresponding foreign products, thereby making up for the blank of the domestic vibration device in this field, and effectively improving the technical content of the vibration test device in China. The products have been sold to relevant laboratories in the United States, South Korea, COMAC Shanghai, Aerospace Reliability, etc.

The existing moving coil induction ring forms a corresponding vibration under the action of a static magnetic field, but the lower moving coil induction ring generates the induced current, so that the surface temperature will also increase, and the radial expansion of the moving coil induction ring increases. With the increase of expansion, the original motion air gap will be reduced accordingly. In the process of induced draft cooling by fan cooling, the flow of the original cooling air flowing through the surface of the moving coil induction ring is reduced and the wind pressure is increased, which may affect the cooling efficiency. In order to take away the heat from the moving coil induction ring as soon as possible, the efficient evaporative cooling logic control method is still required. A small amount of atomized distilled water vapor is sprayed on the surface of the moving coil induction ring through a spray (liquid nitrogen) cooling apparatus, so that heat generated on the surface of the moving coil induction ring is rapidly vaporized and evaporated, and latent heat is taken away through airflow. The radial expansion size of the moving coil induction ring after being heated is controlled, the effect of improving the heat dissipation effect is achieved, and the fault-free working time of the vibration device is prolonged. Therefore, a new evaporative cooling control logic method is needed to solve the existing problems.

SUMMARY

Based on this, the purpose of the disclosure is to provide an evaporative cooling logic control method and apparatus of an inductive vibration device in order to solve the above problems.

In order to achieve the above purposes, the disclosure provides the following scheme.

The evaporative cooling logic control method of the inductive vibration device may include the following steps.
(1) A Test Runs.
At S1, the vibration device is started and data is acquired.
At S2, a power amplifier displays an effective output current, and whether the effective output current is greater than 600 amperes is judged.
(2) When the Effective Output Current is Greater than 600 Amperes.
At S1, a water inlet solenoid valve is opened, a time relay performs automatic timing, and purified water flows into an air pipe.

At S2, after the water inlet time is reached, the water inlet solenoid valve is closed, an air inlet solenoid valve is opened, an air inlet relay performs automatic timing, and a high-pressure airflow enters the air pipe. When the time is reached, the air inlet solenoid valve is closed.

At S3, the high-pressure airflow entering the air pipe may spray and pressurize the purified water to form misty water droplets and take away a heat on a surface of a moving coil induction ring.

(3) When the Effective Output Current is Less than or Equal to 600 Amperes.

At S1, the water inlet solenoid valve and the air inlet solenoid valve are closed, and the test is continued.

(4) An Infrared Temperature Sensor Monitors the Temperature of the Moving Coil Induction Ring.

At S1, when the temperature of the moving coil induction ring is lower than 260 DEG C., enabling the moving coil induction ring works normally.

At S2, When the moving coil induction ring is greater than 260 DEG C., enabling heat accumulates in a vibration table quickly. The moving coil induction ring has a relatively low intensity at this high temperature, which may affect a normal use of the vibration table. The power amplifier will be automatically shut down to protect a vibration table.

In an embodiment, the high-pressure airflow entering the air pipe sprays and pressurizes the purified water through nozzles. The nozzles are fan-shaped nozzles. The infrared temperature sensor is arranged on an outer side of the moving coil induction ring.

In an embodiment, an air filter device is arranged on an induced draft end of a fan.

An evaporative cooling apparatus of the inductive vibration device is provided and applies the evaporative cooling logic control method of the inductive vibration device as described above. The evaporative cooling apparatus of the inductive vibration device may include a purified water and high-pressure gas mixing water inlet, an air pipe, nozzles and a moving coil induction ring.

The purified water and high-pressure gas mixing water inlet is connected with the air pipe. The purified water and high-pressure gas mixing water inlet is configured to enable the purified water and high-pressure gas to flow into the air pipe. The air pipe is connected with the nozzles. The nozzles are evenly arranged on the outer side of the moving coil induction ring. The nozzles are configured to spray and pressurize the purified water through the high-pressure airflow to realize the cooling of the moving coil induction ring.

In an embodiment, the evaporative cooling apparatus may further include an infrared temperature sensor. The infrared temperature sensor is arranged on the outer side of the moving coil induction ring. The infrared temperature sensor is configured to detect the temperature of the moving coil induction ring.

In an embodiment, the evaporative cooling apparatus may further include the water inlet solenoid valve and the air inlet solenoid valve. The water inlet solenoid valve and the air inlet solenoid valve are both connected with the purified water and high-pressure gas mixing water inlet. The water inlet solenoid valve is configured to control the purified water to flow into the air pipe through the purified water and high-pressure gas mixing water inlet. The air inlet solenoid valve is configured to control the high-pressure gas to flow into the air pipe through the purified water and high-pressure gas mixing water inlet.

Compared with the prior art, the disclosure has the following beneficial effects.

A spray auxiliary cooling mode of the inductive vibration device, which is adjusted by the logic control method of the disclosure, has simple structure and reliable function, can effectively solve the phenomenon of insufficient induced draft and heat dissipation capacity of the prior fan of the moving coil induction ring and reduce its radial expansion, and is especially suitable for heat dissipation of the moving coil induction ring of the inductive vibration device with relatively large moving coil induction ring current and large and medium thrust.

BRIEF DESCRIPTION OF THE DRAWINGS

In order to more clearly explain the embodiments of the disclosure or the technical solutions in the prior art, the drawings to be used in the embodiments will be briefly introduced below. It is apparent that the drawings described below are only some embodiments of the disclosure. For those of ordinary skill in the art, other drawings can be obtained according to these drawings without paying creative labor.

REFERENCE SIGNS

1. Purified water and high-pressure gas mixing water inlet; 2. Air pipe; 3. Nozzles; 4. Induction ring profile; 5. Spray angle; 10. Inductive vibration device; 11. Vibration table; 12. Power amplifier; 13. Water inlet solenoid valve; 14. Time relay; 15. Air inlet solenoid valve; 16. Air inlet relay; 17. Infrared temperature sensor; 18. Fan; 181. Induced draft end.

DETAILED DESCRIPTION OF THE EMBODIMENTS

The technical solutions in the embodiments of the disclosure will be clearly and completely described in conjunction with the drawings in the embodiments of the disclosure. It is apparent that the described embodiments are only a part of the embodiments of the disclosure, and not all of them. All other embodiments obtained by those skilled in the art based on the embodiments of the disclosure without creative efforts shall fall within the scope of the disclosure.

In order to make the above purposes, features and advantages of the disclosure more obvious and easy to understand, the disclosure is further described below in conjunction with the accompanying drawings and the specific implementation modes.

Figure 2:
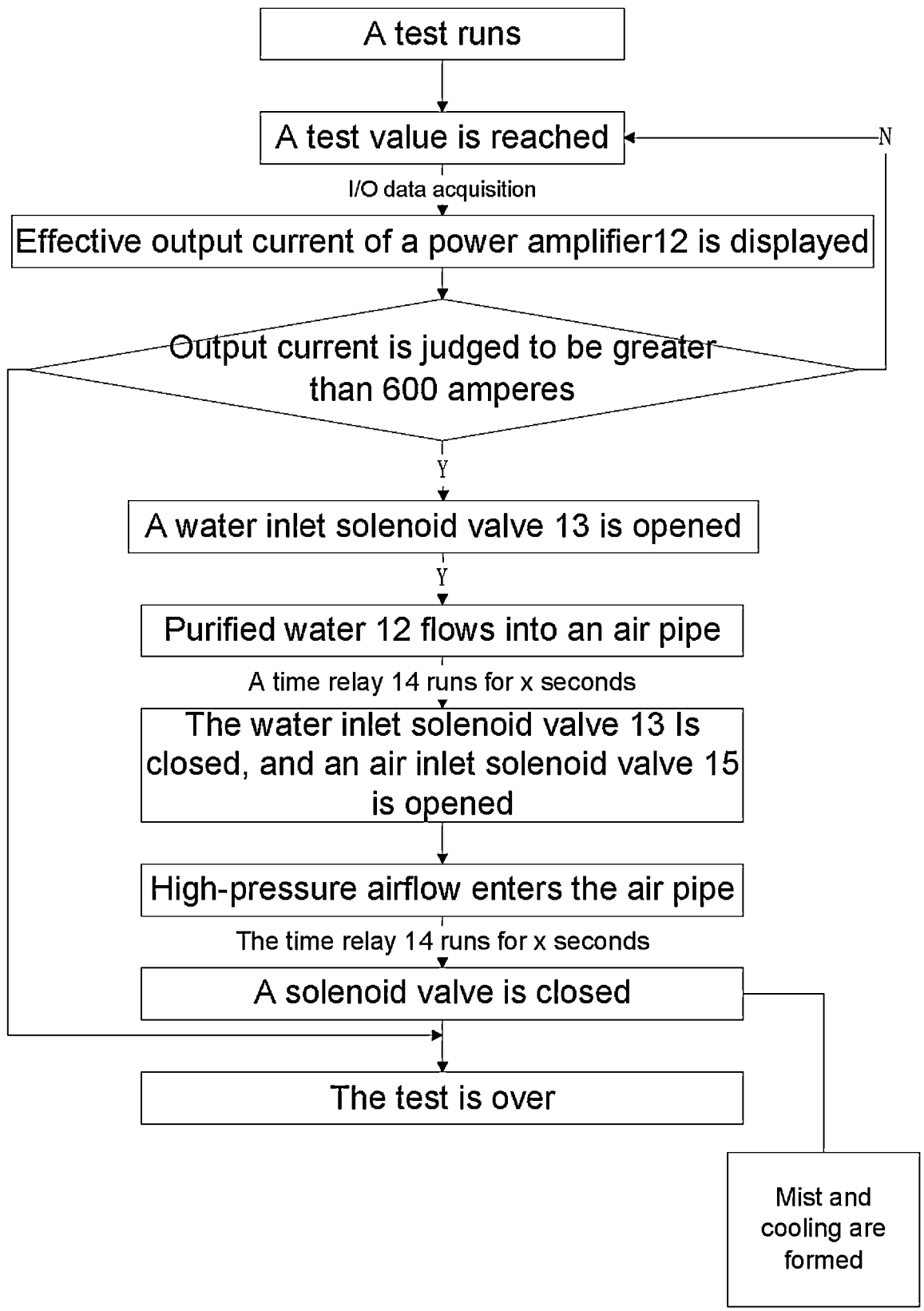
FIG. 2 is a circuit logic control diagram of the evaporative cooling logic control method of the inductive vibration device of the disclosure.

As shown in FIG. 2, an evaporative cooling logic control method of an inductive vibration device may include the following steps.

(1) A Test Runs.

At S1, the vibration device is started and data is acquired.

At S2, a power amplifier 12 displays an effective output current, and whether the effective output current is greater than 600 amperes is judged.

(2) When the Effective Output Current is Greater than 600 Amperes.

At S1, a water inlet solenoid valve 13 is opened, a time relay 14 performs automatic timing, and purified water flows into an air pipe.

At S2, after the water inlet time is reached, the water inlet solenoid valve 13 is closed, an air inlet solenoid valve 15 is opened, an air inlet relay 16 performs automatic timing, and a high-pressure airflow enters the air pipe. When the time is reached, the air inlet solenoid valve 15 is closed.

At S3, the high-pressure airflow entering the air pipe may spray and pressurize the purified water to form misty water droplets and take away a heat on a surface of a moving coil induction ring.

(3) When the Effective Output Current is Less than or Equal to 600 Amperes.

At S1, the water inlet solenoid valve 13 and the air inlet solenoid valve 15 are closed, and the test is continued.

(4) An Infrared Temperature Sensor 17 Monitors the Temperature of the Moving Coil Induction Ring.

At S1, when the temperature of the moving coil induction ring is lower than 260 DEG C., the moving coil induction ring works normally.

At S2, when the moving coil induction ring is greater than 260 DEG C., heat accumulates in a vibration table 11 quickly. The moving coil induction ring has a relatively low intensity at this high temperature, which may affect a normal use of the vibration table 11. The power amplifier 12 may be automatically shut down to protect a vibration table 11.

In the embodiment, the high-pressure airflow entering the air pipe sprays and pressurizes the purified water through nozzles. The nozzles are fan-shaped nozzles. The infrared temperature sensor 17 is arranged on an outer side of the moving coil induction ring.

In the embodiment, an air filter device is arranged on the induced draft end 181 of a fan 18.

Figure 1:
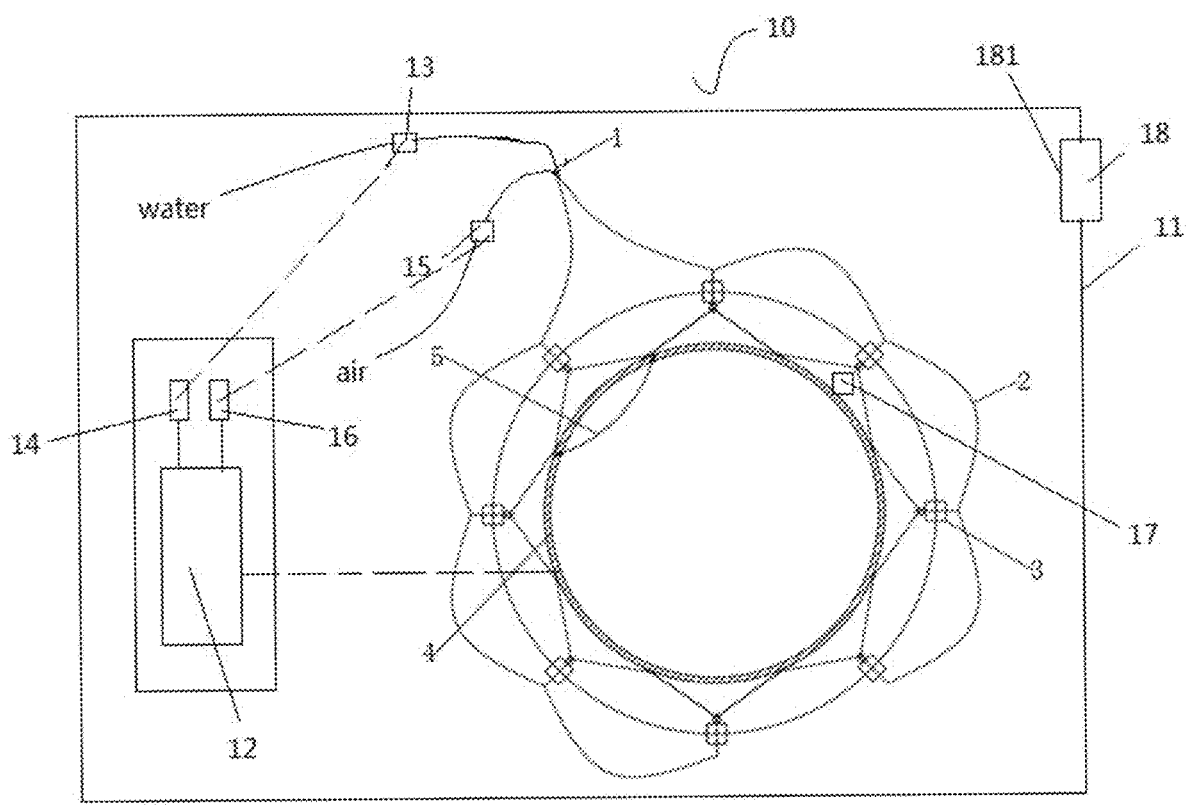
FIG. 1 is a cooling structure diagram of an evaporative cooling logic control method of an inductive vibration device of the disclosure.

As shown in FIG. 1, an evaporative cooling apparatus of the inductive vibration device 10 is provided and applies the evaporative cooling logic control method of the inductive vibration device 10 as described above. The evaporative cooling apparatus of the inductive vibration device 10 may include a purified water and high-pressure gas mixing water inlet 1, an air pipe 2, nozzles 3 and a moving coil induction ring.

The purified water and high-pressure gas mixing water inlet 1 is connected with the air pipe 2. The purified water and high-pressure gas mixing water inlet 1 is configured to enable the purified water and high-pressure gas to flow into the air pipe 2. The air pipe 2 is connected with the nozzles 3. The nozzles 3 are evenly arranged on the outer side of the moving coil induction ring. The nozzles 3 are configured to spray and pressurize the purified water through the high-pressure airflow to realize the cooling of the moving coil induction ring. Herein, the plurality of nozzles 3 are arranged. The spray angles 5 of the nozzles cover the whole induction ring profile 4.

In actual application, the evaporative cooling apparatus may further include an infrared temperature sensor 17. The infrared temperature sensor 17 is arranged on the outer side of the moving coil induction ring. The infrared temperature sensor 17 is configured to detect the temperature of the moving coil induction ring.

In actual application, the evaporative cooling apparatus may further include the water inlet solenoid valve 13 and the air inlet solenoid valve 15. The water inlet solenoid valve 13 and the air inlet solenoid valve 15 are both connected with the purified water and high-pressure gas mixing water inlet 1. The water inlet solenoid valve 13 is configured to control the purified water to flow into the air pipe 2 through the purified water and high-pressure gas mixing water inlet 1. The air inlet solenoid valve 15 is configured to control the high-pressure gas to flow into the air pipe 2 through the purified water and high-pressure gas mixing water inlet 1.

In practical application, the evaporative cooling apparatus may further include a fan and an air filter device. The air filter device is provided with an induced draft end 181 of the fan 18. The fan 18 is arranged at the bottom of the vibration device. A heat dissipation mode of induced draft and cooling is adopted. The air enters the device through a reserved channel on the upper part of the vibration table 11. After the heat is taken away from the device through air gap channels on the inner and outer sides of the moving coil induction ring, the heat is connected with the fan 18 through the air pipe at the bottom of the device. Finally, the heat is sprayed to the peripheral air through an exhaust duct of the fan 18. At the same time, the air filter device is arranged on the induced draft end 181 of the fan 18. The spray nozzles are evenly arranged around the moving coil induction ring. After the moving coil induction ring reaches the corresponding temperature, a spray device is triggered to spray mist on the surface of the moving coil induction ring, and the airflow in the air gap can take excess mist and heat away from the surface of the vibration table 11 through the channel to ensure the reliability of its long time work.

The various embodiments in the present specification are described in a progressive manner, and each embodiment focuses on differences from other embodiments, and the same similar parts between the various embodiments can be referred to each other. For the system disclosed in the embodiment, since it corresponds to the method disclosed in the embodiment, the description is relatively simple, and the relevant parts can be referred to the method part.

Specific examples are used herein to illustrate the principles and implementation of the disclosure. The description of the above examples is only used to facilitate understanding the method and core idea of the disclosure; at the same time, for those of ordinary skill in the art, according to the disclosure, there may be some changes in the specific implementation and scope of application. In summary, the content of the specification should not be construed as a limitation to the disclosure.

What is claimed is:

1. An evaporative cooling logic control method of an inductive vibration device, comprising the following steps:
   (1) running a test:
   S1, starting the vibration device and acquiring data;
   S2, displaying an effective output current by a power amplifier, and judging whether the effective output current is greater than 600 amperes;
   (2) when the effective output current is greater than 600 amperes:
   S1, opening a water inlet solenoid valve, performing automatic timing by a time relay, and enabling purified water to flow into an air pipe;
   S2, after the water inlet time is reached, closing the water inlet solenoid valve, opening an air inlet solenoid valve, performing automatic timing by an air inlet relay, enabling a high-pressure airflow to enter the air pipe, and closing the air inlet solenoid valve when the time is reached;
   S3, spraying and pressurizing the purified water, by the high-pressure airflow entering the air pipe, to form misty water droplets, and taking away heat on a surface of a moving coil induction ring;
   when the effective output current is less than or equal to 600 amps:
   S1, closing the water inlet solenoid valve and the air inlet solenoid valve, and continuing the test; and monitoring a temperature of the moving coil induction ring by an infrared temperature sensor:
S1, when the temperature of the moving coil induction ring is lower than 260 DEG C., enabling the moving coil induction ring to work normally;
S2, when the temperature of the moving coil induction ring is greater than 260 DEG C., enabling heat to accumulate in a vibration table quickly, wherein the moving coil induction ring has a low intensity at this high temperature, which affects a normal use of the vibration table, and the power amplifier is automatically shut down to protect the vibration table.

2. The evaporative cooling logic control method of the inductive vibration device according to claim 1, wherein the high-pressure airflow entering the air pipe sprays and pressurizes the purified water through nozzles; the nozzles are fan-shaped nozzles; the infrared temperature sensor is arranged on an outer side of the moving coil induction ring.

3. The evaporative cooling logic control method of the inductive vibration device according to claim 1, wherein an air filter device is arranged on an induced draft end of a fan.

4. An evaporative cooling apparatus of the inductive vibration device, wherein the evaporative cooling apparatus of the inductive vibration device according to claim 1 comprises the purified water and high-pressure gas mixing water inlet, the air pipe, nozzles and the moving coil induction ring:
the purified water and the high-pressure gas mixing water inlet is connected with the air pipe; the purified water and high-pressure gas mixing water inlet is configured to enable the purified water and high-pressure gas to flow into the air pipe; the air pipe is connected with the nozzles; the nozzles are evenly arranged on the outer side of the moving coil induction ring; the nozzles are configured to spray and pressurize the purified water through the high-pressure airflow to realize the cooling of the moving coil induction ring.

5. The evaporative cooling apparatus of the inductive vibration device according to claim 4, further comprising the infrared temperature sensor, wherein the infrared temperature sensor is arranged on an outer side of the moving coil induction ring; the infrared temperature sensor is configured to detect the temperature of the moving coil induction ring.

6. The evaporative cooling apparatus of the inductive vibration device according to claim 4, further comprising a water inlet solenoid valve and the air inlet solenoid valve, wherein the water inlet solenoid valve and the air inlet solenoid valve are connected with the purified water and the high-pressure gas mixing water inlet; the water inlet solenoid valve is configured to control the purified water to flow into the air pipe through the purified water and the high-pressure gas mixing water inlet; the air inlet solenoid valve is configured to control the high-pressure gas to flow into the air pipe through the purified water and the high-pressure gas mixing water inlet.

* * * * *